(12) United States Patent
Tran

(10) Patent No.: US 7,158,431 B2
(45) Date of Patent: Jan. 2, 2007

(54) SINGLE TRANSISTOR SENSING AND DOUBLE TRANSISTOR SENSING FOR FLASH MEMORY

(75) Inventor: Hieu Van Tran, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/092,166

(22) Filed: Mar. 28, 2005

(65) Prior Publication Data

US 2006/0215471 A1 Sep. 28, 2006

(51) Int. Cl.
*G11C 7/06* (2006.01)
(52) U.S. Cl. .................. 365/207; 365/185.21; 365/210
(58) Field of Classification Search ................ 365/207, 365/185.2, 185.21, 148, 210; 327/56
See application file for complete search history.

(56) References Cited

U.S. PATENT DOCUMENTS

| 5,699,295 | A | * | 12/1997 | Yero ...................... 365/185.21 |
| 6,282,145 | B1 |  | 8/2001 | Tran |
| 6,639,837 | B1 | * | 10/2003 | Takano et al. ......... 365/185.22 |
| 6,768,678 | B1 | * | 7/2004 | Hsu et al. .............. 365/185.21 |
| 2003/0103406 | A1 |  | 6/2003 | Tran |
| 2005/0249006 | A1 | * | 11/2005 | Tran et al. .................. 365/207 |

* cited by examiner

*Primary Examiner*—Tan T. Nguyen
(74) *Attorney, Agent, or Firm*—DLA Piper US LLP

(57) ABSTRACT

A single sensing transistor is selectively diode connected to a sense line that is coupled to reference cells and data cells to store a reference current or leakage currents on the gate of the sensing transistor by opening the switch to disconnect the diode connection of the sensing transistor. Other sensing systems may use two transistors and may stores leakage current. A sensing system with capacitance auto-zeroing is included. The sensing system may include a dynamic differential current differential amplifier.

22 Claims, 12 Drawing Sheets

SINGLE TRANSISTOR SENSING AND DOUBLE TRANSISTOR SENSING FOR FLASH MEMORY

BACKGROUND OF THE INVENTION

The present invention relates to a sense amplifier, and more particularly relates to a sense amplifier comprising a single sensing transistor or double sensing transistors.

As information technology progresses at an unprecedented pace, the need for information storage increases proportionately. Accordingly, the non volatile information in stationary or portable communication demands higher capability and capacity storage. One approach to increasing the amount of storage is by decreasing physical dimensions of the stored bit (e.g., memory cell) to smaller dimensions such as nanocell technology. Another approach is to increase the storage density per bit. The second approach is known as digital multilevel nonvolatile storage technology. A sense amplifier reads the content of a memory cell by comparison to reference levels. It is desired to have a sense amplifier that can accurately detect the voltage stored in a multilevel nonvolatile memory cell, uses low power, and uses less space for circuit elements.

SUMMARY OF THE INVENTION

The present invention provides a sensing system for a memory. The sensing system comprises a transistor coupled between a voltage terminal and a sense line, which is selectively coupled to a reference cell terminal in a first mode, and to a data cell terminal in a second mode. The sensing system further comprises a switch coupled between the sense line and a bias terminal of the transistor to selectively couple the sense line to the bias terminal in the first mode and to uncouple the bias terminal from the sense line in the second mode.

DETAILED DESCRIPTION

A digital multilevel bit memory array system includes a sensing circuit that comprises one sensing transistor that is used for sensing. The sensing transistor stores either a reference current or a data current and then performs a subsequent read by comparing the stored current with the other of the reference or data currents. The digital multilevel bit memory array system may include sensing circuits with other numbers of transistors. The sensing circuits may provide for leakage compensation and mismatch compensation. The sensing circuits may include dynamic sensing with or without comparator auto zero. Sensing circuits may include dynamic sensing with capacitance mismatch auto zero. The sensing circuits may include complimentary differential current differential amplifiers.

Figure 1:
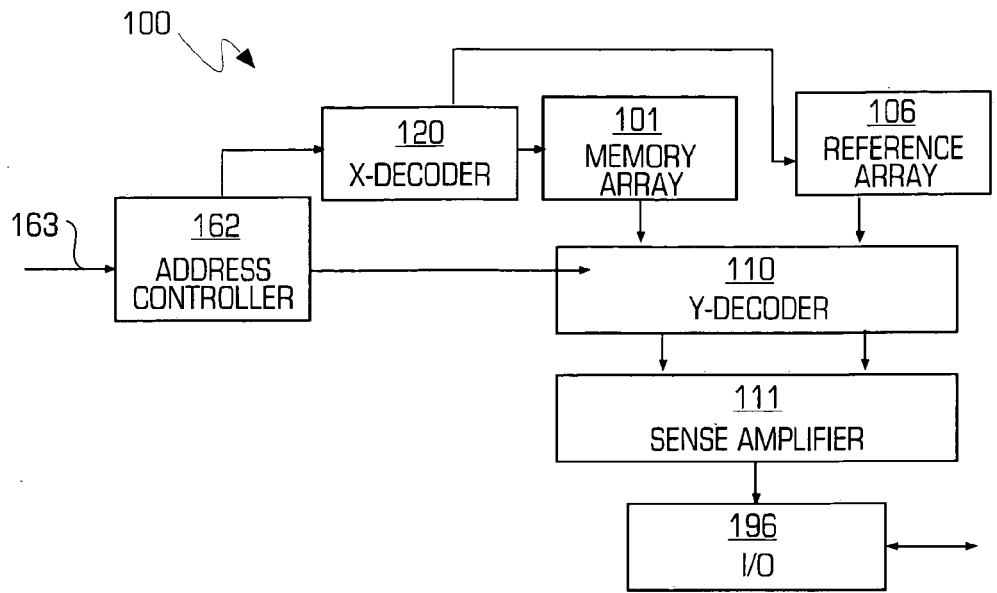
FIG. 1 is a block diagram illustrating a digital multilevel bit memory system.

FIG. 1 is a block diagram illustrating a digital multilevel bit memory array system 100.

The digital multilevel bit memory array system 100 includes a memory array 101 that includes a plurality of memory cells (not shown) and a reference array 106 that includes a plurality of reference memory cells (not shown). An N bit digital multilevel cell is defined as a memory cell capable of storing the $2^N$ levels. The reference array 106 is used as a reference system of reference voltage levels to verify the contents of the memory array 101. In another embodiment, the memory array 101 may include reference memory cells for storing the reference voltage levels.

In one embodiment, the memory array 101 includes a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

The multilevel memory cells of the memory array 101 may be arranged in various ways, such as in rows and columns or in segments. Various addressing schemes may be used which organize the memory cells into bytes, pages or other arrangements.

The digital multilevel bit memory array system 100 further includes an x decoder 120, a y decoder 110, an address controller 162, a sense amplifier circuit 111, and an intelligent input/output interface 196. The y decoder 110 controls bitlines (not shown) coupled to columns in memory cells and the reference voltage cells, during a write, read (or verify), and erase operations. The sense amplifier 111 senses the read data which is provided to the I/O interface 196. The I/O interface 196 also buffers input into the memory array system 100. The sense amplifier 111 also senses the read data and verifies the read data against input data during memory programming or erasing.

In response to an address signal 163 and other control signals (not shown), the address controller 162 decodes the address signal 163 and controls page, byte, segment or other addressing for the x decoder 120 and the y decoder 110. The x decoder 120 selects a row or a block of rows in the arrays 101 and 106 based on the signals from the address controller 162 and provides precise multilevel bias values over temperature, process, and power supply used for consistent single level or multilevel memory operation for the memory array 101.

The system 100 includes power related circuits (not shown), such as band gap voltage generators, charge pumps, voltage regulators, and power management systems, and other control circuits (not shown) such as voltage algorithm controllers.

The system 100 may execute various operations on the memory array 101. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, the operations described in U.S. Pat. No. 6,282,145, incorporated herein by reference above.

Figure 2:
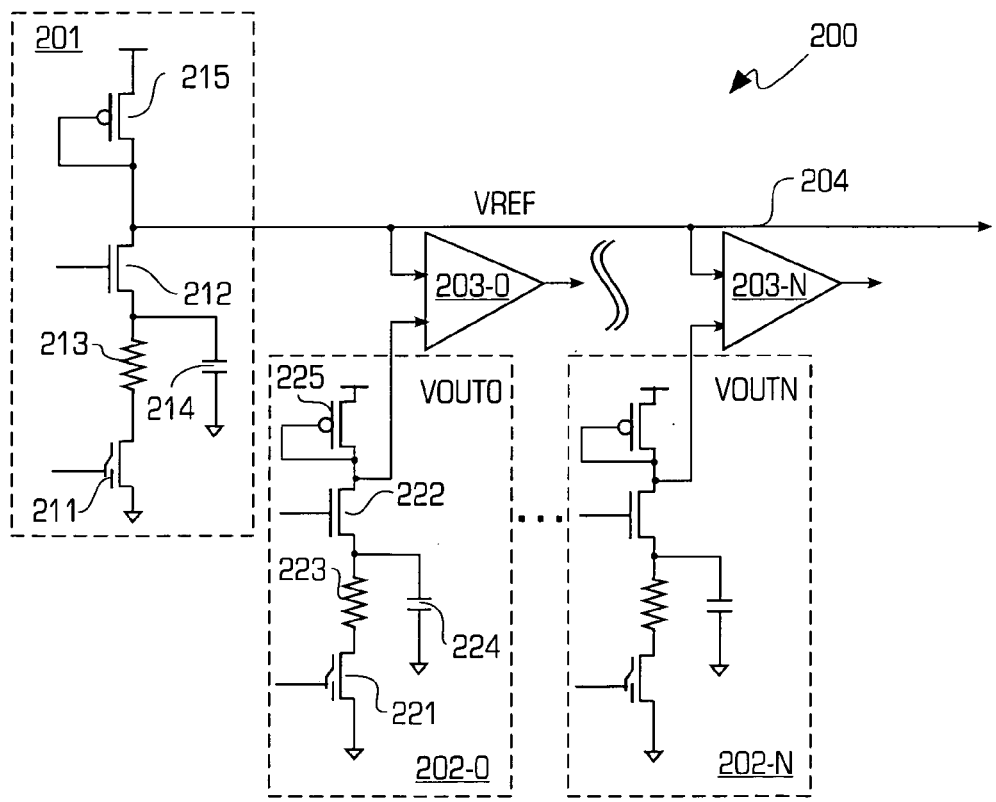
FIG. 2 is a schematic diagram illustrating a conventional sensing system.

FIG. 2 is a schematic diagram illustrating a conventional sensing system 200.

The conventional sensing system 200 comprises a reference column 201, a plurality of data columns 202-0 through 202-N, and a plurality of comparators 203-0 through 203-N. The reference column 201 comprises a reference memory cell 211, an NMOS transistor 212 and a PMOS transistor 215. A bitline resistor 213 is shown to indicate resistance on the bitline. A bitline capacitor 214 is shown to indicate capacitance on the bitline. The reference column 201 provides a voltage reference on the reference line 204 which is applied to a first input of each of the comparators 203-0 through 203-N. Each data column 202 comprises a data memory cell 221, an NMOS transistor 222 and a PMOS transistor 225. A bitline resistor 223 is shown to indicate resistance on the bitline. A bitline capacitor 224 is shown to indicate capacitance on the bitline. Each of the data columns 202-0 through 202-N provides a data output voltage to a second input of a respective comparator 203-0 through 203-N so that the comparator 203 provides an output indicative of the stored data in the corresponding data column 202.

The conventional sensing system 200 has mismatches within the system because of differences in the PMOS transistors 215 and 225 that provide loads for the respective reference column 201 and the data column 202. Further, the comparators 203 have a mismatch in their inputs. These mismatches may lead to inaccurate reads of the data cells 221. Moreover, the bitlines may have a mismatch in capacitances that may lead to inaccurate reads, especially in dynamic reads.

The sense amplifier 111 (FIG. 1) may include the sensing systems of FIGS. 3–18.

Figure 3:
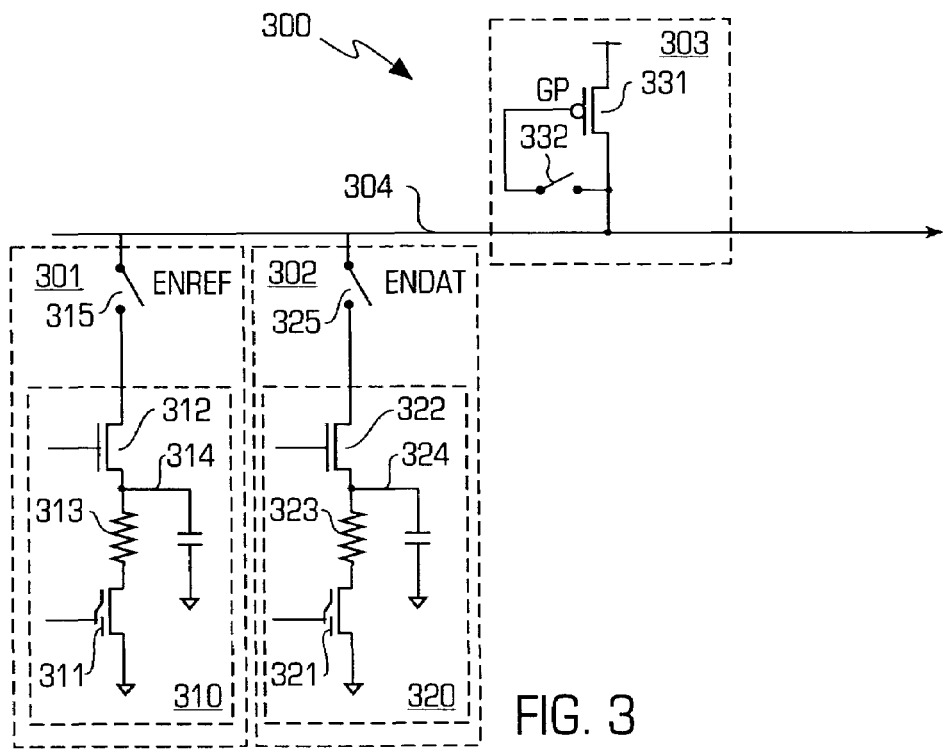
FIG. 3 is a schematic diagram illustrating a first embodiment of a sensing system of the digital multilevel bit memory system of FIG. 1.

FIG. 3 is a schematic diagram illustrating a one transistor sensing system 300.

The one transistor sensing system 300 uses a single transistor for sensing a data cell on a bitline. The one transistor sensing system 300 comprises a reference column 301, a data column 302 and a sense amplifier 303, which may be part of the reference array 106, the memory array 101 and the sense amplifier 111, respectively, of the system 100 (FIG. 1). The reference column 301 comprises a reference cell 310 and an enable switch 315. The reference cell 310 comprises a reference memory cell 311 and an enable switch 312. A bit line resistor 313 is shown to indicate resistance on the bit line. A bit line capacitor 314 is shown to indicate capacitance on the bit line. The switch 315 selectively couples the reference cell 310 to a sense line 304, which is coupled to the sense amplifier 303. The switch 315 may be an NMOS transistor.

The data column 302 comprises a data cell 320 and an enable switch 325. The data cell 320 comprises a data memory cell 321 and an enable switch 322. A bit line resistor 323 is shown to indicate resistance on the bit line. A bit line capacitor 324 is shown to indicate capacitance on the bit line. The switch 325 selectively couples the data cell 320 to the sense line 304. The switch 325 may be an NMOS transistor.

The sense amplifier comprises a PMOS sensing transistor 331 and a switch 332. In one embodiment, the switch 332 is a CMOS transistor. In another embodiment, the switch 332 is a CMOS switch with charge compensation, such as the charge compensation circuits described below in conjunction with FIGS. 19–20. In another embodiment, a capacitor is coupled between the gate of the transistor 331 to either a supply voltage VDD or ground to increase the storage capacity of the gate of the transistor 331.

The operation of the one transistor sensing system 300 is now described. In a reference current storage mode, the reference current of the reference memory cell 311 is sensed and stored as a voltage in the sense amplifier 303 to establish a reference. In a data sensing mode, the data current of the data memory cell 321 is sensed and compared to the reference current stored in the sense amplifier 303. More particularly, in the reference current storage mode, the reference cell 310 is enabled (e.g., by closing the switch 315) and the data cell 320 is disabled (e.g., by opening the switch 325). A reference current from the reference memory cell 311 is stored as a gate potential on the gate of the PMOS transistor 331 of the sense amplifier 303 by closing the switch 332 to diode connect the PMOS transistor 331 and to apply the voltage read from the reference cell 311 to the gate of the PMOS transistor 331, and then by opening the switch 332 to store the voltage on the gate. In the data sensing mode, the reference cell 310 is disabled (e.g., by opening the switch 315) and the data cell 320 is enabled (e.g., by closing the switch 325). The reference current stored as a voltage biases the gate of the PMOS transistor 331 so that the PMOS transistor 331 generates a current equal to the reference current. The data cell 321 is sensed and the data current is compared to the reference current on the sense line 304 for reading the data memory cell 321. If the reference current is greater than the data current, the voltage on the sense line 304 switches to the high power supply (e.g., VDD). If the reference current is less than the data current, the voltage on the sense line 304 switches to the low power supply (e.g., ground).

In one embodiment, margin sensing is implemented using the PMOS transistor 331 as multiple transistors with appropriate sizing with separate enabling for each transistor. By enabling or disabling each transistor with proper sizing, different ratios of the reference current may be used for sensing to achieve different margin sensing. This approach may be used with the sensing systems described herein to achieve margin sensing including dynamic sensing.

In another embodiment, margin sensing is implemented using multiple current sources/sinks coupled to the sense line 304 with appropriate sizing and separate enabling for each current source/sink. By enabling or disabling each current source/sink with proper sizing, different ratios of reference currents may be used for sensing to achieve different margin sensing. This approach may be used for the sensing systems described herein to achieve margin sensing including dynamic sensing.

In an alternative embodiment, the sensing system 300 may be used with the data current storage mode performed first and then sensing against the reference current.

Figure 4:
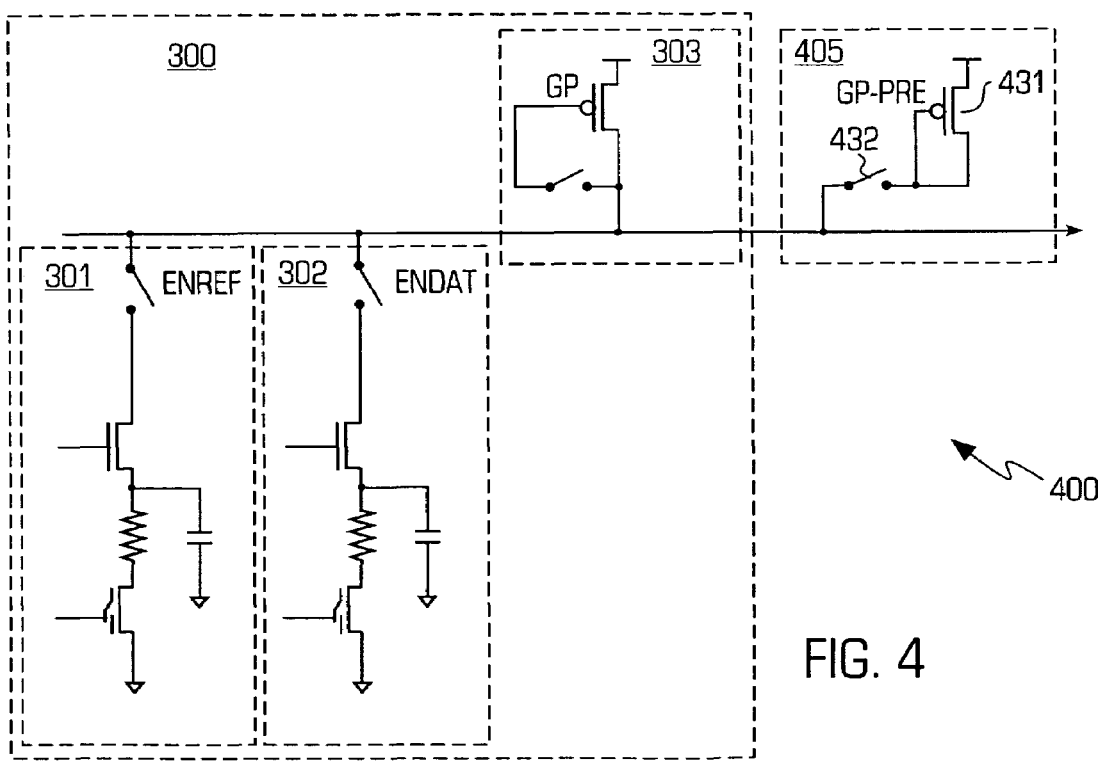
FIG. 4 is a schematic diagram illustrating a second embodiment of a sensing system of the digital multilevel bit memory system of FIG. 1.

FIG. 4 is a schematic diagram illustrating a one transistor sensing system 400.

The one transistor sensing system 400 provides pre-charging of the sensing line. The one transistor sensing system 400 comprises a one transistor sensing system 300 (FIG. 3) and a pre-charge circuit 405. (For simplicity and clarity, reference numerals of some elements of the system 300 are not shown on FIG. 4.) The pre-charge circuit 405 comprises a diode connected PMOS transistor 431 and a switch 432. The switch 432 selectively couples the PMOS transistor 431 to the sense line 304 to pre-charge the sense line 304 before sensing of the data cell 320. Alternatively, the PMOS transistor 431 may be operated in a linear region in a connected mode to precharge the sense line 304 to the supply voltage VDD to implement preferred 'high' sensing. Alternatively, an NMOS transistor may be used in place of the PMOS transistor 431 to operate in a diode connected mode or in a linearly connected mode to precharge the sense line 304 to ground to implement preferred 'low' sensing.

The operation of the one transistor sensing system 400 is now described. The operation of the one transistor sensing system 400 includes a reference current storage mode and a data sensing mode similar to that described above in conjunction with FIG. 3, and further includes a precharging mode between the reference current storage mode and the data sensing mode. During the precharging mode, the sense line 304 is precharged so that when the data current of the data memory cell 321 is read the swing in voltage of the sense line 304 is reduced on the average and thus the sensing is faster. In the precharging mode, the reference column 301 is disabled (e.g., by opening the switch 315) and the pre-charge circuit 405 is enabled (e.g., by closing the switch 332) to allow the transistor 431 to precharge the sense line 304. The precharge circuit 405 is disabled (e.g., by opening the switch 432). The data sensing mode is then performed.

Figure 5:
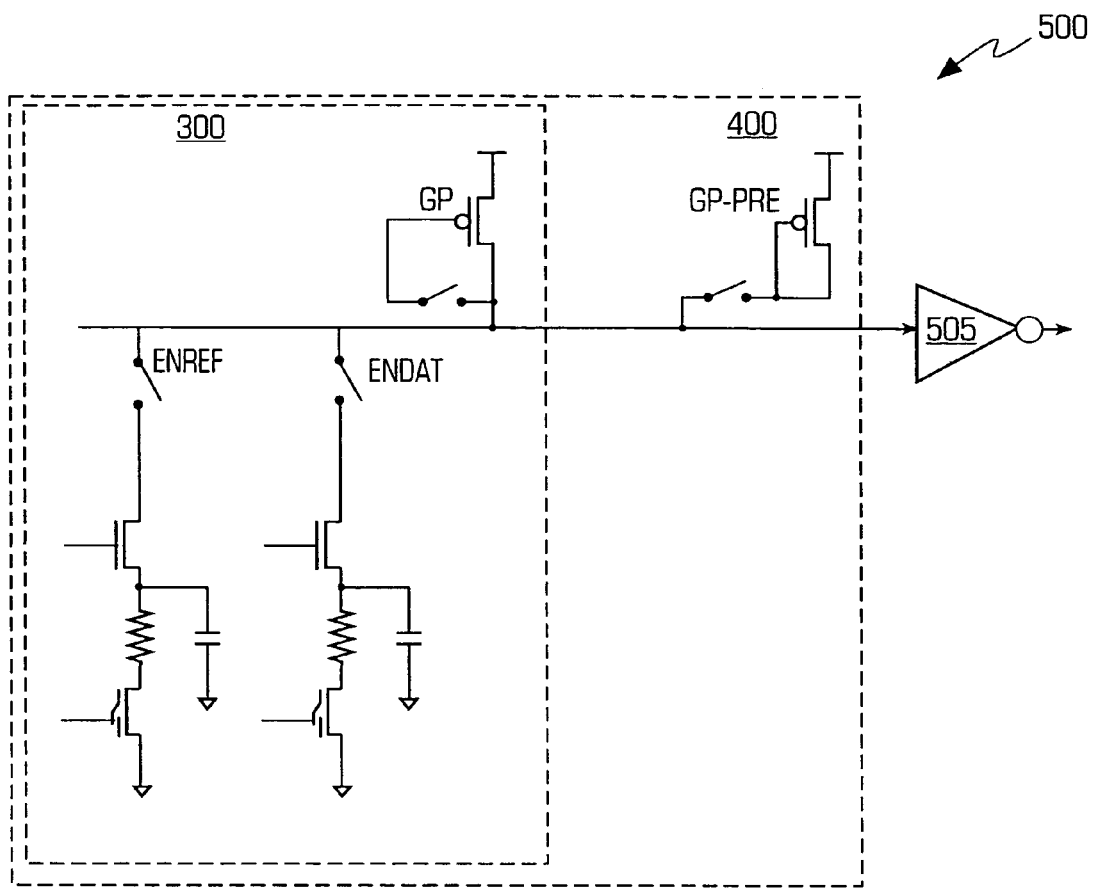
FIG. 5 is a schematic diagram illustrating a third embodiment of a sensing system of the digital multilevel bit memory system of FIG. 1.

FIG. 5 is a schematic diagram illustrating a one transistor sensing system 500.

The one transistor sensing system 500 provides buffering of the sense line. The one transistor sensing system 500 comprises a one transistor sensing system 400 (FIG. 4) and a buffer 505. (For simplicity and clarity, reference numerals of some elements of the system 400 are not shown in FIG. 5.) The buffer 505 is coupled to the sense line 304 to buffer the sense data voltage. The buffer 505 may be, for example, an inverter buffer, a source follower circuit or an operational amplifier circuit.

The operation of the one transistor sensing system 500 is similar to that of the one transistor sensing system 400 (FIG. 4).

Figure 6:
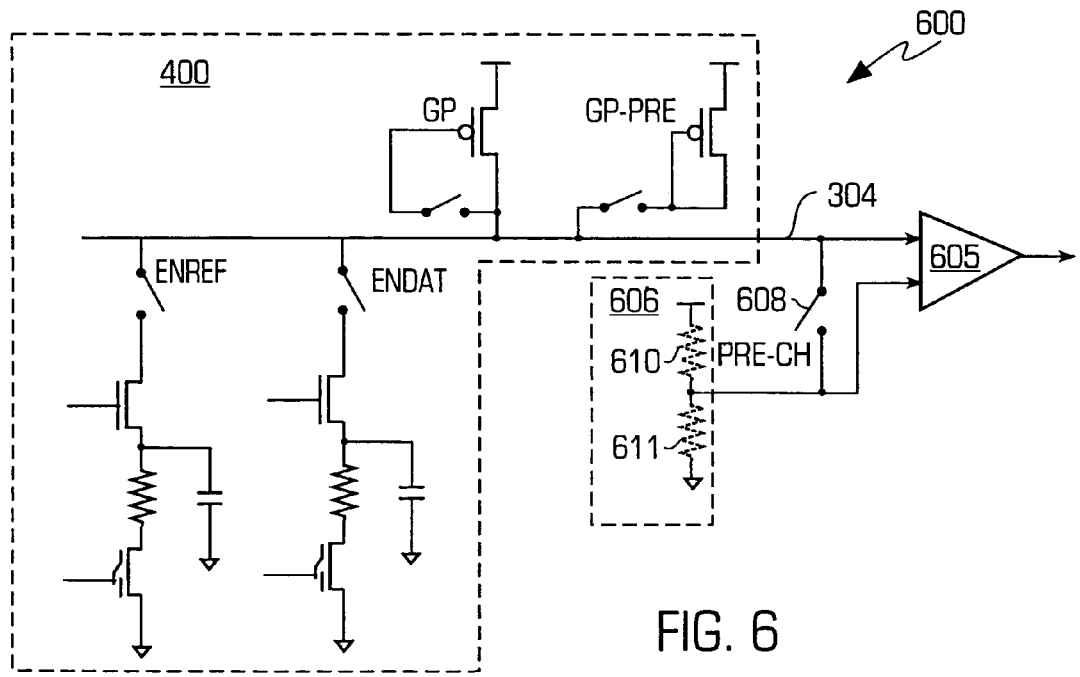
FIG. 6 is a schematic diagram illustrating a fourth embodiment of a sensing system of the digital multilevel bit memory system of FIG. 1.

FIG. 6 is a schematic diagram illustrating a one transistor sensing system 600.

The one transistor sensing system 600 provides an output based on comparing the sensed data to a fixed reference voltage. The one transistor sensing system 600 comprises a one transistor sensing system 400 (FIG. 4), a differential amplifier 605, a reference source 606, and a pre-charge switch 608. (For simplicity and clarity, reference numerals of some elements of the system 400 are not shown in FIG. 6.) In one embodiment, the reference source 606 comprises a plurality of resistors 610 and 611 coupled in series between a supply voltage and ground as a voltage divider to provide a reference voltage to an input terminal of the differential amplifier 605. The differential amplifier 605 generates an output based on the difference between the reference voltage and the voltage on the sense line 304.

In another embodiment, the one transistor sensing system 600 does not include a precharge circuit 405 in the one transistor sensing system 400, but instead the reference source 606 may be used to precharge the sense line 304 by closing the precharge switch 608.

The operation of the one transistor sensing system 600 is similar to that of the one transistor sensing system 400 (FIG. 4).

Figure 7:
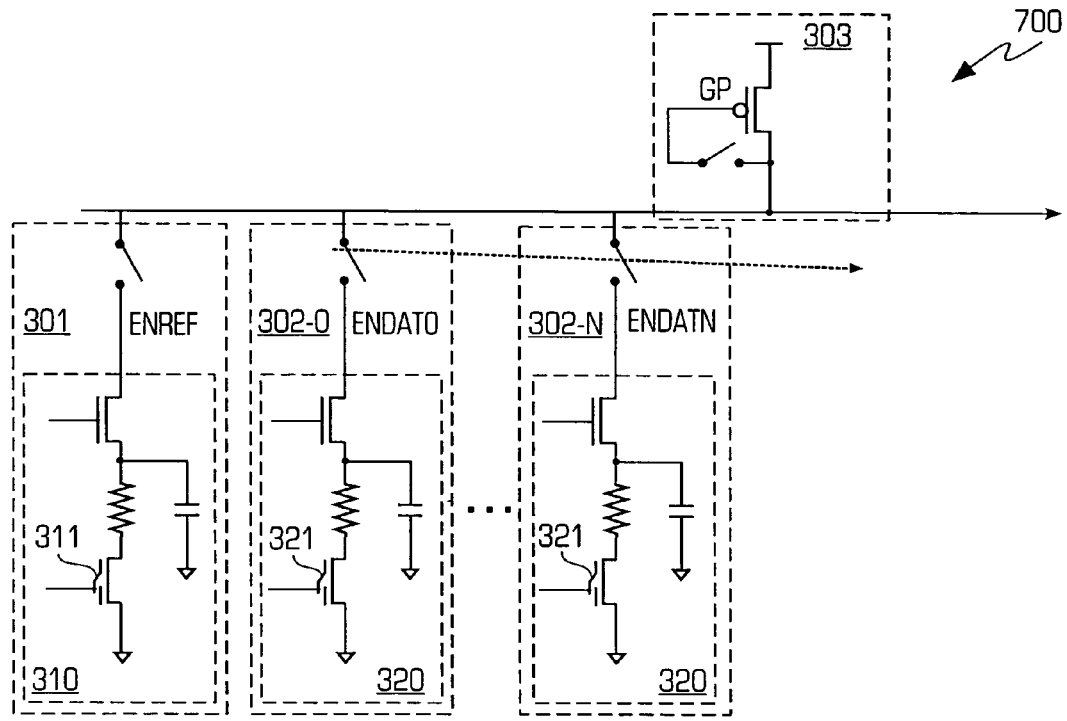
FIG. 7 is a schematic diagram illustrating a sensing system with serial data sensing of the digital multilevel bit memory system of FIG. 1.

FIG. 7 is a schematic diagram illustrating a one transistor sensing system 700.

The one transistor sensing system 700 provides serial data sensing. The one transistor sensing system 700 comprises a reference column 301, a plurality of reference data columns 302-0 through 302-N, and a sense amplifier 303. (For simplicity and clarity, reference numerals for some elements of the reference column 301, the data columns 302 and the sense amplifier 303 are not shown in FIG. 7.) The plurality of data columns 302-0 through 302-N are coupled to the sense line 304 to allow each of the data cells 321 of the data column 302 to be sensed by the sense amplifier 303.

The operation of the one transistor sensing system 700 is now described. In a reference current storage mode, the reference current of the reference memory cell 311 is sensed and stored as a voltage in the sense amplifier 303 to establish a reference. In a data serial sensing mode, the data current of the data memory cell 321 of each of the data columns 302-0 through 302-N is sensed and compared to the reference current stored in the sense amplifier 303. More particularly, the reference current storage mode is similar to the reference current storage mode described above in conjunction with FIG. 3. In the data serial sensing mode, a data sensing mode is performed successively for each of the data columns 302-0 through 302-N. The reference cell 310 is disabled (e.g., by opening the switch 315) and the data cell 320 of one data column 302 is enabled (e.g., by closing the switch 325) and the data cells 320 of the other data columns 302 are disabled (e.g., by opening the switch 325). The stored reference current on the gate biases the PMOS transistor 331 so that the PMOS transistor 331 generates a current equal to the reference current. The data cell 321 is sensed and the data current is compared to the reference current on the sense line 304 for reading the data memory cell 321. Each data column 302 is successively read by repeating a data sensing mode on each data column 302.

Figure 8:
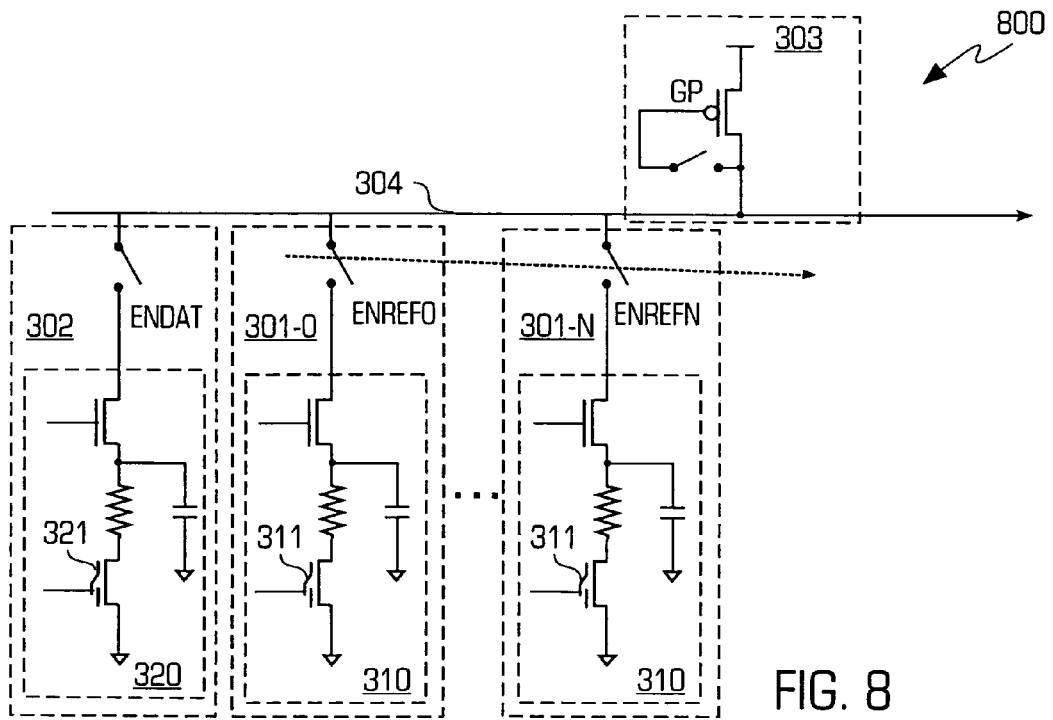
FIG. 8 is a schematic diagram illustrating a sensing system with serial reference sensing of the digital multilevel bit memory system of FIG. 1.

FIG. 8 is a schematic diagram illustrating a one transistor sensing system 800.

The one transistor sensing system 800 provides for serial reference sensing of reference memory cells. The serial reference sensing may be used, for example, for binary searching for multilevel memory cells. The one transistor sensing system 800 comprises a plurality of reference columns 301-0 through 301-N, a data column 302, and a sense circuit 303. (For simplicity and clarity, reference numbers for some elements of the reference columns 301, the data column 302, and the sense circuit 303 are not shown in FIG. 7.) The plurality of reference columns 301-0 through 301-N are coupled to the sense line 304 to allow each of the reference cells 311 of the reference column 302 to be stored in the sense amplifier 303. The selection of the reference columns 301 that are sensed may be done in a manner to perform a binary search for sensing the data in the data column 302.

The operation of the one transistor sensing system 800 is now described. The system 800 is operated by performing a data current storage mode and a serial reference current sensing mode by successively selecting the reference column 301-0 through 301-N for comparison to the stored data current. More particularly, the data current storage mode is similar to the reference storage mode described above in conjunction with FIG. 3, but instead the data current from the data column 302 is stored in the sense amplifier 303. The reference columns 301-0 through 301-N are disabled (e.g., by opening the switch 315) and the data column 302 is enabled (e.g., by closing the switch 325). The data current from the data memory cell 321 is stored as a gate potential on the gate of the PMOS transistor 331 of the sense amplifier 303 by closing the switch 332 to diode connect the PMOS transistor 331 and to apply the voltage read from the data cell 321 to the gate of the PMOS transistor 331, and then by opening the switch 332 to store the voltage on the gate. In the serial reference sensing mode, a reference sensing mode is performed successively for each of the reference columns 301-0 through 301-N. The data column 301 is disabled (e.g., by opening the switch 325) and the reference cell 310 of one reference column 301 is enabled (e.g., by closing the switch 315) and the reference cells 310 of the other reference columns 301 are disabled (e.g., by opening the switch 315). The stored data current on the gate biases the PMOS transistor 331 so that the PMOS transistor 331 generates a current equal to the data current. The reference cell 311 is sensed and the reference current is compared to the data current on the sensing line 301 for reading the reference memory cell 311. Each reference column 301 is successively read by repeating a reference sensing mode on each reference column 301. In another embodiment, the reference columns are read based on a binary search to read the contents of the data cell 321 stored in the sense amplifier 303.

In another embodiment, a plurality of data columns 302 may be coupled to the sense line 304 and the serial reference sensing may be performed for each of the data columns 302 by first performing a data current storage mode for each data column 302 and a reference serial sensing mode.

Figure 9:
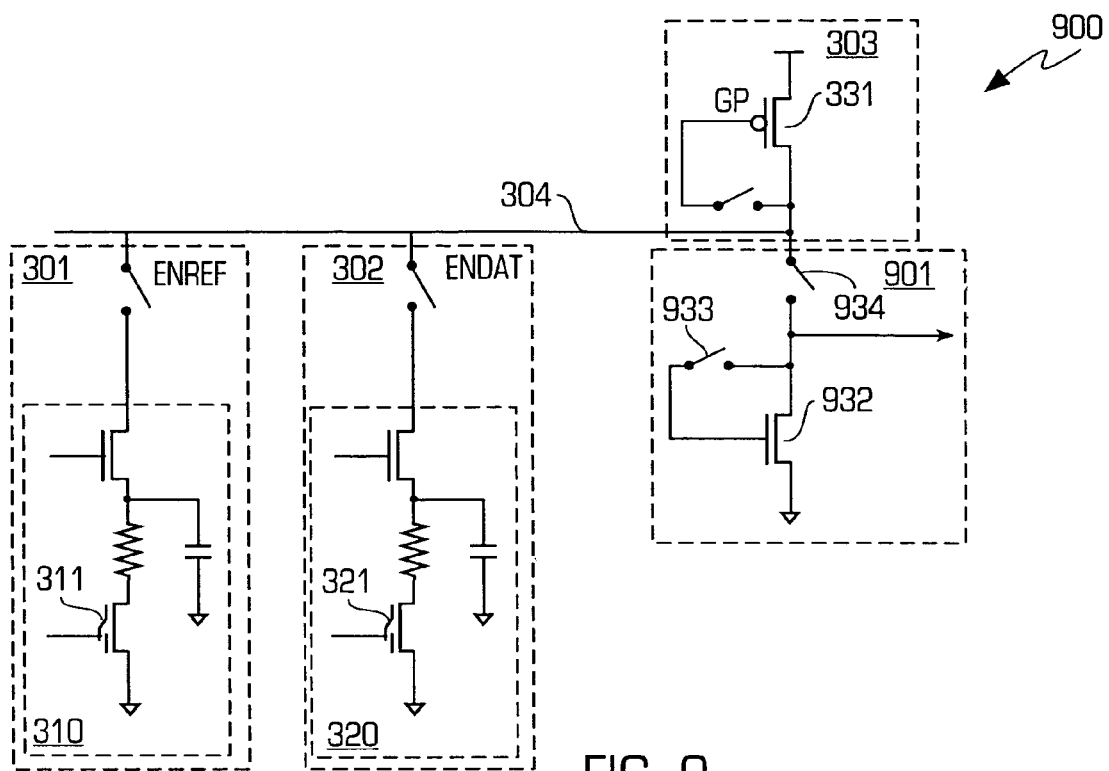
FIG. 9 is a schematic diagram illustrating a two transistor sensing system of the digital multilevel bit memory system of FIG. 1.

FIG. 9 is a schematic diagram illustrating a two transistor sensing system 900.

The two transistor sensing system 900 comprises a reference column 301, a data column 302, a sense amplifier 303, and a sense amplifier 901. (For simplicity and clarity, reference numbers for some elements of the reference column 301, the data column 302 and the sense amplifier 303 are not shown in FIG. 9.) The sense amplifier 901 comprises a PMOS transistor 932 and a plurality of switches 933 and 934. The switch 933 selectively diode connects the PMOS transistor 932 during a storage operation. The switch 934 selectively couples the PMOS transistor 932 to the sense line 304 during a transfer mode and a sensing mode.

The operation of the two transistor sensing system 900 is now described. In a reference current storage mode, the reference current of the reference memory cell 311 is sensed and stored as a voltage in the sense amplifier 303 to establish a reference. In a transfer mode, the stored reference is transferred from the sense amplifier 303 to the sense amplifier 901. In a data current storage mode, the data current of the data memory cell 321 is sensed and stored as a voltage in the sense amplifier 303. In a data sensing mode, the data current stored in the sense amplifier 303 is compared to the reference current stored in the sense amplifier 901. More particularly, the reference current storage mode is similar to the reference current storage mode described above in conjunction with FIG. 3, and the sense amplifier 901 is disabled (e.g., by opening the switch 934). In the transfer mode, the reference cell 310 is disabled (e.g., by opening the switch 315) and the sense amplifier 901 is enabled (e.g., by closing the switch 934). Further, the reference current stored in the sense amplifier 303 is transferred to the sense amplifier 901 by closing the switch 933 to diode connect the NMOS transistor 932 and to apply the voltage on the sense line 304 to the gate of the NMOS transistor 932, and then by opening the switch 933 to store the voltage on the gate. In the data current storage mode, the sense amplifier 901 is disabled (e.g., by opening the switch 934), the reference column 301 is disabled (e.g., by opening the switch 315) and the data column 302 is enabled (e.g., by closing the switch 325). The data current from the data memory cell 321 stored as a gate potential on the gate of the PMOS transistor 331 of the sense amplifier 303 by closing the switch 332 to diode connect the PMOS transistor 331 and to apply the voltage read from the data cell 321 to the gate of the PMOS transistor 331, and then by opening the switch 332 to store the voltage on the gate. In the data sensing mode, the data column 302 is disabled (e.g., by opening the switch 325) and the sense amplifier 901 is enabled (e.g., by closing the switch 934). The stored data current on the gate biases the PMOS transistor 331 and the stored reference current on the gate biases the NMOS transistor 932 to generate a comparison of the stored currents on the sense line 304.

In an alternative embodiment, the two transistor sensing system 900 may be used so that one reference may be used with multiple data cells.

Figure 10:
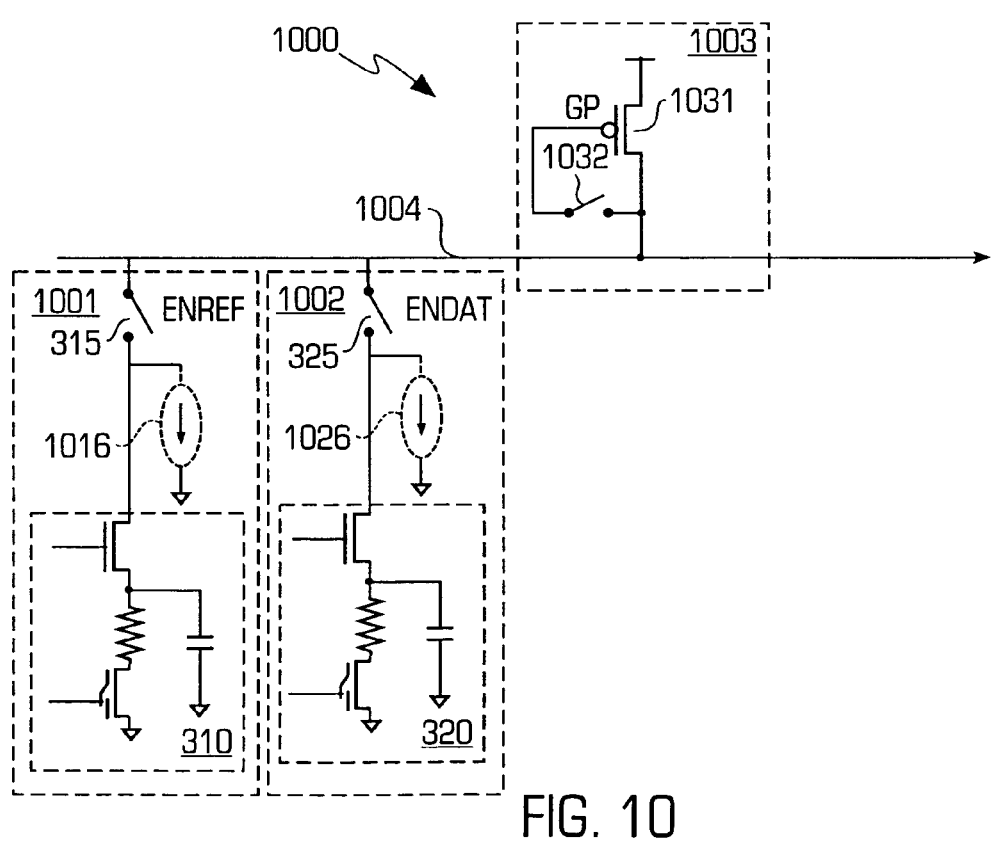
FIG. 10 is a schematic diagram illustrating a first embodiment of a sensing system with leakage current cancellation of the digital multilevel bit memory system of FIG. 1.

FIG. 10 is a schematic diagram illustrating a one transistor sensing system 1000.

The one transistor sensing system 1000 provides a sensing scheme that includes leakage cancellation for reference memory cells and data memory cells. The one transistor sensing system 1000 comprises a reference column 1001, a data column 1002 and a sense amplifier 1003. The reference column 1001 is similar to the reference column 301 (FIG. 3) but includes a reference leakage current that is indicated as a reference leakage source 1016. The data column 1002 is similar to the data column 302 (FIG. 3) but includes a data leakage current indicated as a data leakage source 1026. (For simplicity and clarity, reference numerals for some elements of the reference cell 310 and the data cell 320 are not shown in FIG. 10.) The sense amplifier 1003 comprises a PMOS transistor 1031 and a switch 1032 which are arranged in a similar manner as the sensing amplifier 303 (FIG. 3).

The operation of the one transistor sensing system 1000 is now described. In a reference current storage mode, the reference current of the reference memory cell 311, the reference leakage current (1016), and the data leakage current (1026) are sensed and stored as a voltage in the sense amplifier 1003 to establish a reference. In a data sensing mode, the data current of the data memory cell 321, the reference leakage current, and the data leakage current are sensed and compared to the reference current, the reference leakage current, and the data leakage current stored in the sense amplifier 1003. More particularly, in the reference current storage mode, the reference column 1001 is enabled (e.g., by closing the switch 315), the reference cell 310 is enabled (e.g., by setting the associated word line high), the data column 1002 is enabled (e.g., by closing the switch 325), and the data cell 320 is disabled (e.g., by setting the associated word line low). A reference current from the reference memory cell 311, the reference leakage current 1016, and the data leakage current 1026 are stored as a gate potential on the gate of the PMOS transistor 1031 of the sense amplifier 1003 by closing the switch 1032 to diode connect the PMOS transistor 1031 and to apply the currents from the reference cell 311 and the leakages to the gate of the PMOS transistor 1031, and then by opening the switch 1032 to store the voltage on the gate. In the data sensing mode, the reference column 1001 is enabled (e.g., by closing the switch 315), the reference cell 310 is disabled (e.g., by setting the associated word line low), the data column 1002 is enabled (e.g., by closing the switch 325), and the data cell 320 is enabled (e.g., by setting the associated word line high). The stored reference current, the reference leakage current, and the data leakage current on the gate biases the PMOS transistor 1031. The data cell 321 is sensed and the data current, the data leakage current and the reference leakage current are compared to the reference current and the leakage currents from the PMOS transistor 1031, which are applied to the sense line 1004 for reading the data memory cell 321. This embodiment uses different word lines for the reference and the data.

Figure 11:
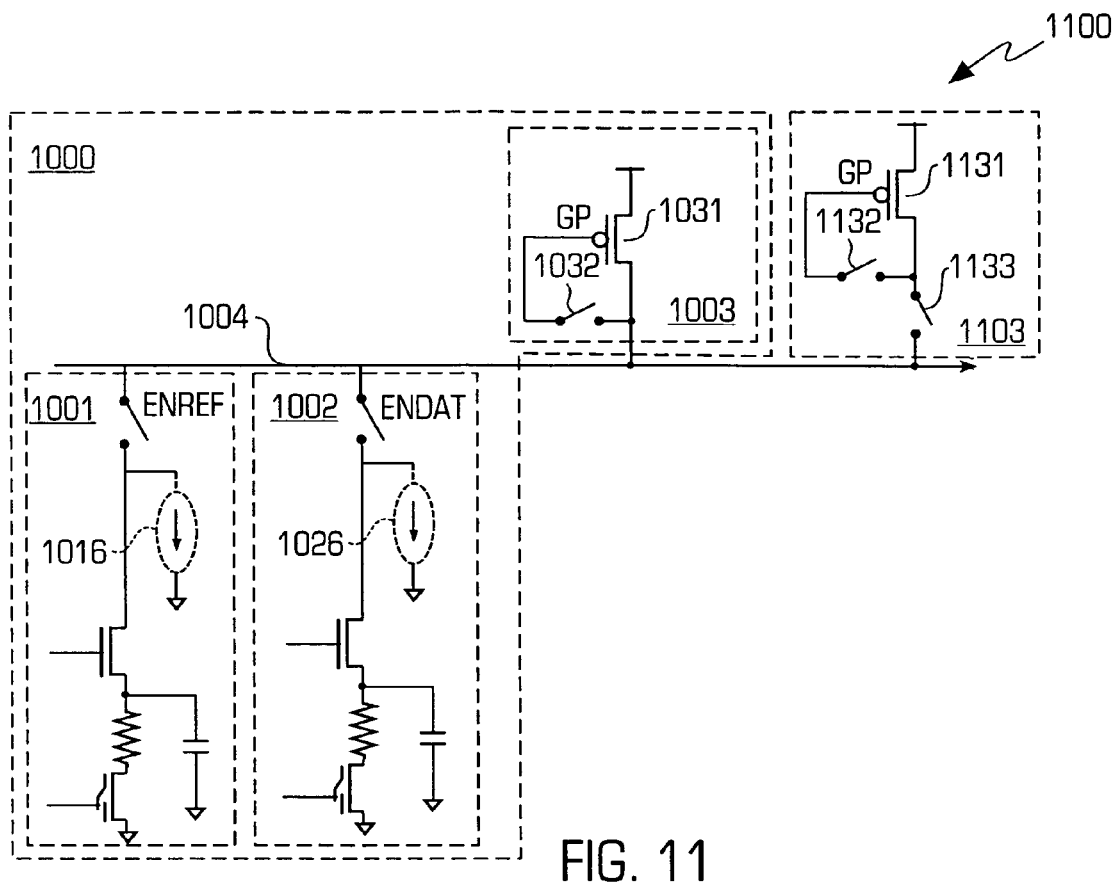
FIG. 11 is a schematic diagram illustrating a second embodiment of a sensing system with leakage current cancellation of the digital multilevel bit memory system of FIG. 1.

FIG. 11 is a schematic diagram illustrating a one transistor sensing system 1100.

The one transistor sensing system 1100 provides a sensing scheme that includes leakage cancellation for reference memory cells and data memory cells. The one transistor sensing system 1100 comprises a one transistor sensing system 1000 and a sense amplifier 1103. (For simplicity and clarity, some reference numerals for the elements of the one transistor sensing system 1000 are not shown in FIG. 11.) The sense amplifier 1103 comprises a PMOS transistor 1131 and a plurality of switches 1132 and 1133. In this embodiment, the same word line is used for the reference cell 311 and the data cell 321.

The operation of the one transistor sensing system 1100 is now described. In a first reference current storage mode, the reference leakage current (1016) is sensed and stored as a voltage in the sense amplifier 1003 to establish a reference leakage circuit. In a second reference current storage mode, the reference current of the reference memory cell 311 is sensed and stored as a voltage in the sense amplifier 1103 to establish a reference current. In a data current storage mode, the data leakage current (1026) is sensed and stored as a voltage in the sense amplifier 1003. In a data sensing mode, the data current of the data memory cell 311 and the data leakage current are sensed and compared to the data leakage current stored in the sense amplifier 1003 and the reference current stored in the sense amplifier 1103. More particularly, in the first reference current storage mode, the reference leakage current is sensed and stored in the sense amplifier 1003. The reference column 1001 is enabled (e.g., by closing the switch 315), the reference cell 310 is disabled (e.g., by setting the associated word line low), the data column 1002 is disabled (e.g., by opening the switch 325), and the sense amplifier 1103 is disabled (e.g., by opening the switch 1133). A leakage current from the reference column 1001 is stored as a gate potential on the PMOS transistor 1031 of the sense amplifier 1003 by closing the switch 1032 to diode connect the PMOS transistor 1031 and to apply the leakage current from the reference column 310 to the gate of the PMOS transistor 1031, and then by opening the switch 1032 to store the voltage on the gate. In the second reference current storage mode, the reference current is stored in the sense amplifier 1103 using the reference leakage current stored in the sense amplifier 1003 to compensate for the leakage current in the reference column 1001. The reference cell 310 is enabled (e.g., by setting the associated word line high) and the sense amplifier 1103 is enabled (e.g., by closing the switch 1133). The reference current from the reference memory cell 311 is stored as a gate potential on the gate of the PMOS transistor 1131 of the sense amplifier 1103 by using the stored leakage current in the sense amplifier 1003 to offset the reference leakage current in the reference column 1001. The reference current is stored as a gate potential on the gate of the PMOS transistor 1131 by closing the switch 1132 to diode connect the PMOS transistor 1131 and to apply the currents from the reference cell 311 with the reference leakage currents offset to cancel each other, and then by opening the switch 1132 to store the voltage on the gate. In the data current storage mode, the data leakage current is stored in the sense amplifier 1003. The reference column 1001 is disabled (e.g., by opening the switch 315), the sense amplifier 1103 is disabled (e.g., by opening the switch 1133), the data column 1002 is enabled (e.g., by closing the switch 325), and the data cell 320 is disabled (e.g., by setting the associated word line low). The data leakage current is stored as a gate potential on the gate of the PMOS transistor 1031 of the sense amplifier 1003 by closing the switch 1032 to diode connect the PMOS transistor 1031 and to apply the data leakage current to the gate of the PMOS transistor 1031, and then by opening the switch 1031 to store the voltage on the gate. In the data sensing mode, a data cell 320 is now enabled (e.g., by setting the associated word line high) and the sense amplifier 1103 is enabled (e.g., by closing the switch 1133). The data cell 321 is sensed and the data current and the data leakage data current are compared to the stored data leakage current and the reference current from the sense amplifiers 1003 and 1103, respectively, for reading the data memory cell 321.

Figure 12:
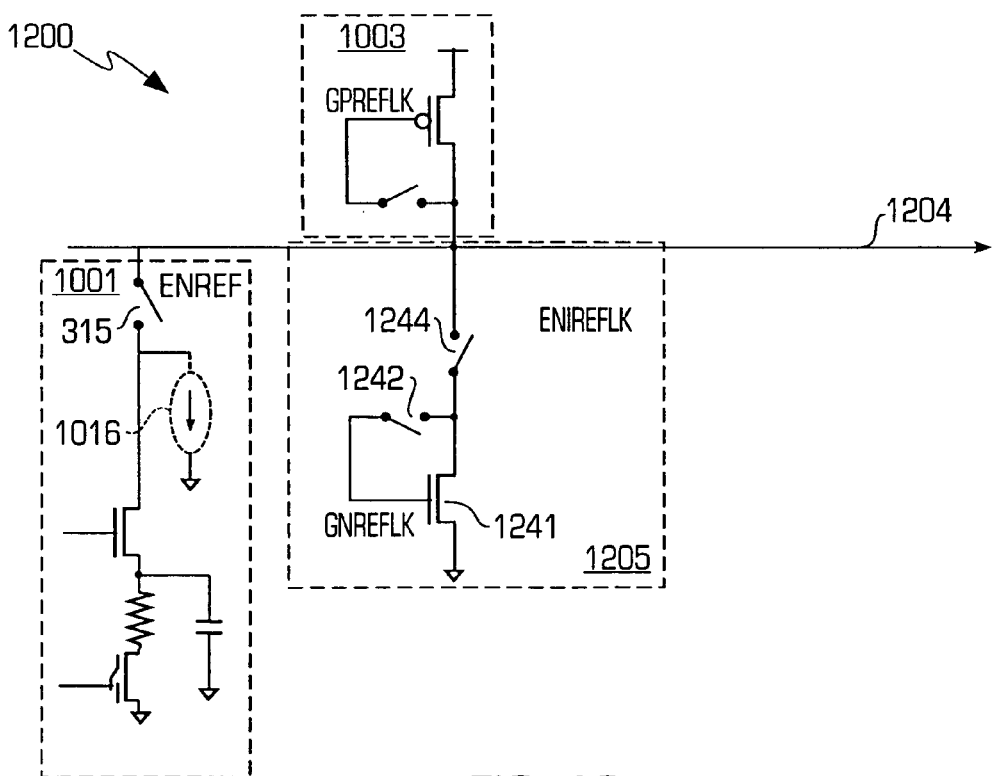
FIG. 12 is a schematic diagram illustrating a third embodiment of a sensing system with leakage current cancellation of the digital multilevel bit memory system of FIG. 1.

FIG. 12 is a schematic diagram illustrating a sensing system 1200.

The sensing system 1200 provides a sensing scheme that includes leakage cancellation for reference memory cells and data memory cells. The sensing system 1200 comprises a reference column 1001, a sense amplifier 1003, and a storage circuit 1205. The storage circuit 1205 comprises a NMOS transistor 1241, and a plurality of switches 1242 and 1244.

The operation of the one transistor sensing system 1200 is now described. In a first reference current storage mode, the reference leakage current (1016) sensed and stored as a voltage in the sense amplifier 1003 to establish a reference leakage current. In a second reference current storage mode, reference leakage current stored in the sense amplifier 1003 is transferred to the storage circuit 1205. In a third reference current storage mode, the reference current of the reference memory cell 311 and the reference leakage current (1016) are sensed and stored as a voltage in the sense amplifier 1003 to establish a net reference current with the reference leakage current stored in the storage circuit 1205 to cancel the reference leakage current stored in the sense amplifier 1003. More particularly, the first reference current storage mode is similar to the reference current storage mode described for the one transistor sensing system 1000 (FIG. 10), and the storage circuit 1205 is disabled (e.g., by opening the switch 1244). The second reference current storage mode is similar to the transfer mode of the two transistor sensing system 900. In this mode, the reference cell 310 is disabled (e.g., by opening the switch 315), and the storage circuit 1205 is enabled (e.g., by closing the switch 1244). The reference current stored in the sense amplifier 1003 is transferred to the storage circuit 1205 by closing the switch 1242 to diode connect the NMOS transistor 1241 and to apply the voltage on the sensing line 1204 to the gate of the NMOS transistor 1241, and then by opening the switch 1242 to store the voltage on the gate. In the third reference current storage mode, the storage circuit 1205 is disabled (e.g., by opening the switch 1244), the reference cell 310 is enabled (e.g., by closing the switch 315). The reference current of the reference memory cell 311 and the reference leakage current (1016) are sensed and stored as a voltage in the sense amplifier 1003 by closing the switch 1032 and then opening the switch 1032 to store the reference current and the reference leakage current on the gate of the PMOS transistor 1031. The system 1200 then establishes a net reference current with the reference leakage current stored in the storage circuit 1205 (when enabled) canceling the reference leakage current stored in the sense amplifier 1003.

Figure 13:
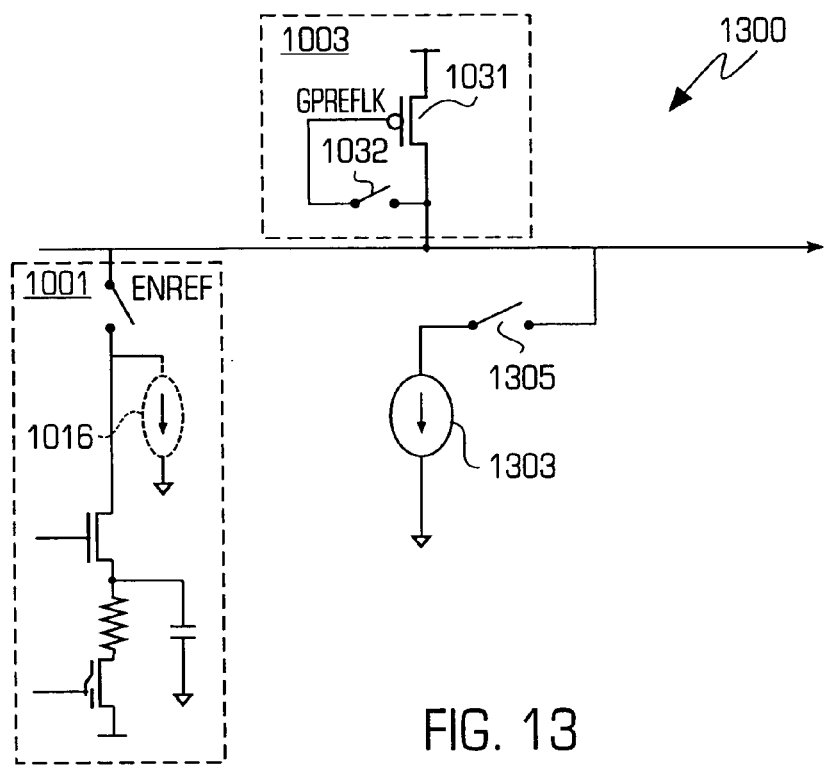
FIG. 13 is a schematic diagram illustrating a fourth embodiment of a sensing system with leakage current cancellation of the digital multilevel bit memory system of FIG. 1.

FIG. 13 is a schematic diagram illustrating a sensing system 1300.

The sensing system 1300 provides leakage cancellation during voltage mode sensing. The sensing system 1300 comprises a reference column 1001, a sense amp 1003, a bias current source 1303, and a switch 1305. (For simplicity and clarity, reference numerals for some elements of the data column 1001 are not shown in FIG. 13.)

The operation of the sensing system 1300 is now described. In a reference leakage current storage mode, the reference leakage current of the reference column 1001 is sensed and stored as a voltage in the sense amplifier 1003 to establish a reference leakage current. In a reference voltage sensing mode, the memory cell is sensed by a bias current from the current bias source 1303 with the stored leakage current in the sense amplifier 1003 canceling the leakage current (1016). More particularly, in the reference leakage current storage mode, the reference column 1001 is enabled (e.g., by closing the switch 315), the reference cell 311 is disabled (e.g., by setting the associated word line low), and the bias current source 1303 is disabled (e.g., by opening the switch 1305). The reference leakage current is stored as a gate potential on the gate of the PMOS transistor 1031 by closing the switch 1032 to diode connect the PMOS transistor 1031 and to apply the currents from the reference cell 311 to the gate of the PMOS transistor 1031, by opening a switch 1032 to store the voltage on the gate. In the reference voltage sensing mode, the reference column 1001 is enabled (e.g., by closing the switch 315), the reference cell 311 is enabled (e.g., by setting the associated word line and source line high), and the bias current source 1303 is enabled (e.g., by closing the switch 1305). The stored leakage current in the sense amplifier 1003 offsets the leakage current of the reference column 1001 so that the reference call 311 is read using the current bias source 1303 to sense the output voltage in a voltage sensing mode.

Figure 14:
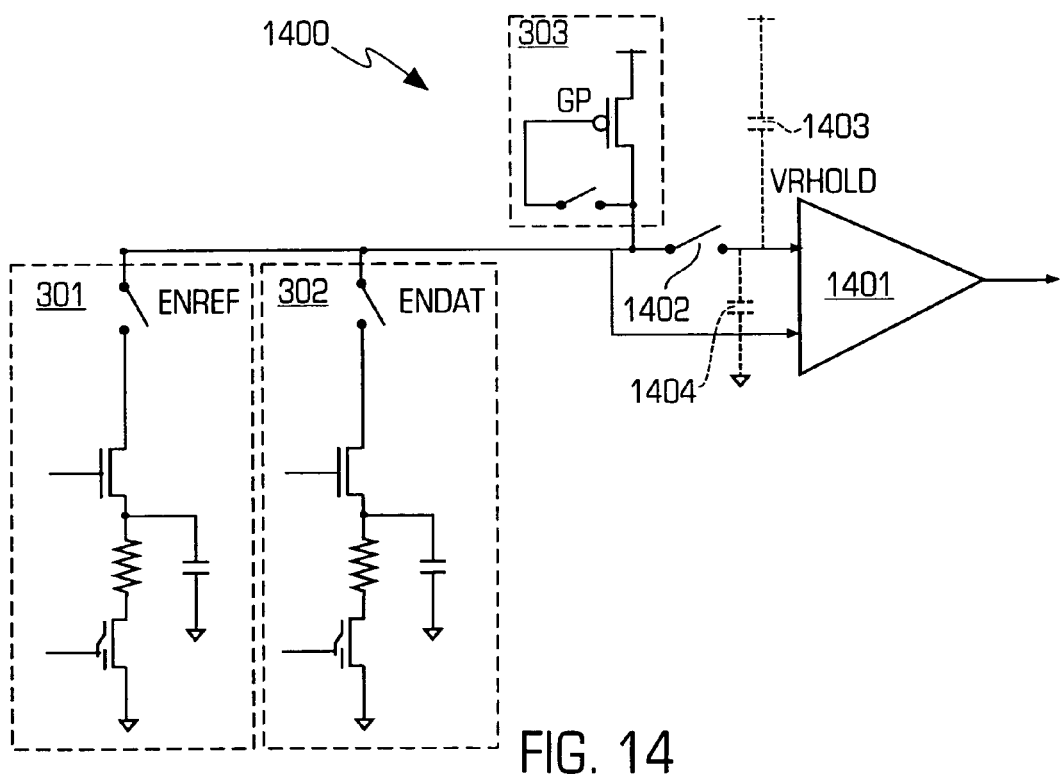
FIG. 14 is a schematic diagram illustrating a sensing system with a differential amplifier of the digital multilevel bit memory system of FIG. 1.

FIG. 14 is a schematic diagram illustrating a sensing system 1400.

The sensing system 1400 performs reads using a differential amplifier. The sensing system 1400 comprises a reference column 301, a data column 302, a sense amplifier 303, a differential amplifier 1401, a switch 1402, and a plurality of capacitors 1403 and 1404. (For simplicity and clarity, reference numerals for some elements of the reference column 301, the data column 302, and the sense amplifier 303 are not shown in FIG. 14.) The capacitors 1403 and 1404 may be formed of global bit line metal or may be an interconnect capacitor.

The operation of the sensing system 1400 is now described. In a reference current storage mode, the reference current of the reference memory cell 311 is sensed and stored as a voltage in a sense amplifier 303 and in the capacitors 1403 and 1404. In a data sensing mode, the data current of the data memory cell is sensed and compared to the reference current stored in the sense amplifier 303 and in the capacitors 1403 and 1404. More particularly, in a reference current storage mode, the reference cell 310 is enabled (e.g., by closing the switch 315) and the data cell 320 is disabled (e.g., by opening the switch 325). Further, the capacitors 1403 and 1404 are enabled by closing the switch 1402. A reference current from the reference memory cell 311 is stored as a potential in the capacitors 1403 and 1404 by closing and opening the switch 1402. The reference current is stored as a gate potential on the PMOS transistor 331 of the sense amplifier 303 by closing and opening the switch 332 to store the voltage on the gate of the PMOS transistor 331. In the data sensing mode, the reference cell is disabled (e.g., by opening the switch 315) and the data cell 320 is enabled (e.g., by closing the switch 325). The voltage from the data column 302 is applied to a second input of the differential amplifier 1401 as a comparison of the stored reference current in the sense amplifier 303 and the data current from the data memory 321. The leakage cancellation schemes described herein may be applied in conjunction with the sensing system 1400.

Figure 15:
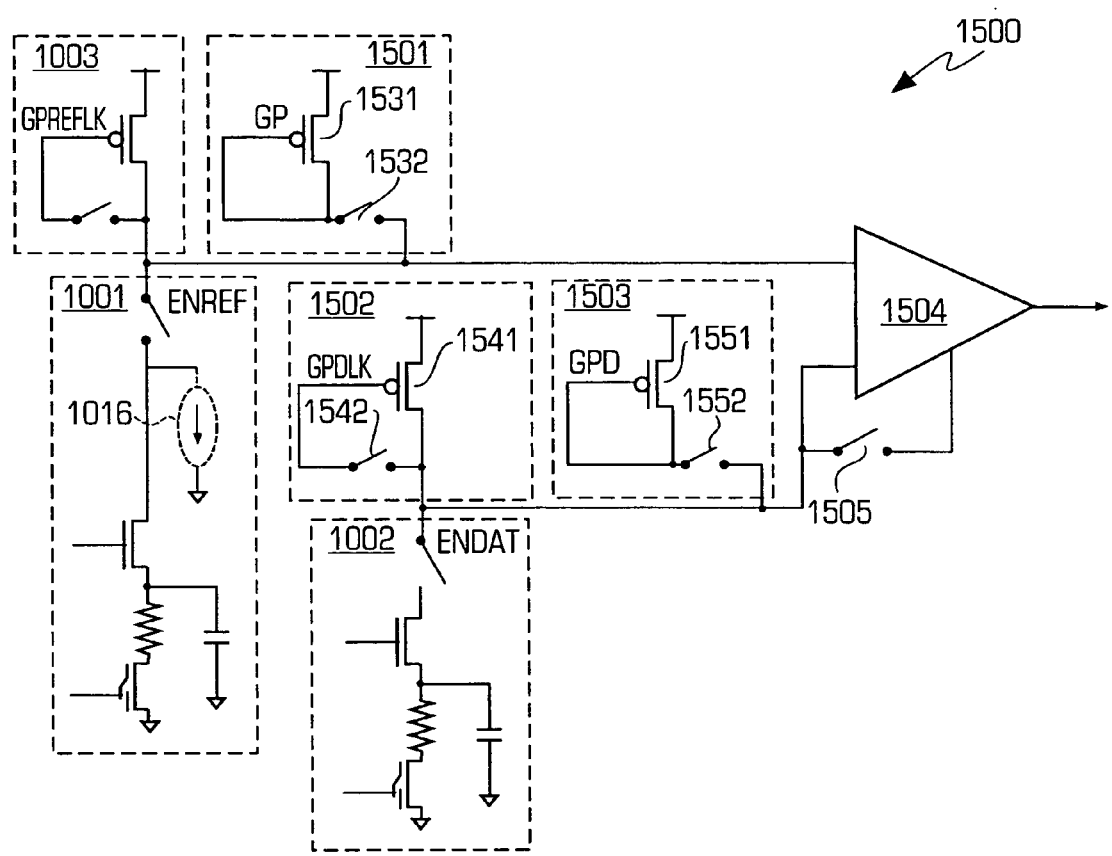
FIG. 15 is a schematic diagram illustrating a sensing system with differential sensing and leakage current cancellation of the digital multilevel bit memory system of FIG. 1.

FIG. 15 is a schematic diagram illustrating a sensing system 1500.

The sensing system 1500 uses differential sensing and provides leakage current cancellation. The sensing system 1500 comprises a reference column 1001, a data column 1002, a plurality of sense amplifiers 1501, 1502 and 1503, an operational amplifier 1504, and a switch 1505. (For simplicity and clarity, reference numerals of some elements of the reference column 1001, the data column 1002, and the sense amplifier 1003 are not shown in FIG. 15.) The sense amplifier 1501 comprises a PMOS transistor 1531 and a switch 1532. The sense amplifier 1502 comprises a PMOS transistor 1541 and a switch 1542. The sense amplifier 1503 comprises a PMOS transistor 1551 and a switch 1552.

The operation of the sensing system 1500 is now described. In a reference leakage current storage mode, the reference leakage current of the reference column 1003 is sensed and stored as a voltage in the sense amplifier 1003 to establish a reference leakage cancellation current. In a data leakage current storage mode, the data leakage current is sensed and stored as a voltage in the sense amplifier 1502 to establish a data leakage cancellation current. In a data sensing mode, the reference current of the reference column 1001 and the data current of the data column 1002 are sensed and compared to each other using the stored cancellation currents in the sense amplifiers 1003 and 1502. More particularly, in the reference leakage current storage mode, the reference column 1001 is enabled (e.g., by closing the switch 315), the reference cell 310 is disabled (e.g., by setting the associated word line low), and the sense amplifier 1501 is disabled (e.g., by opening the switch 1532). The storage of the reference leakage current in the sense amplifier 1003 is performed in a manner similar to that described above in conjunction with FIG. 10. In the data leakage current storage mode, the data column 1002 is enabled (e.g., by closing the switch 325), the data cell 320 is disabled (e.g., by setting the associated word line low), and the sense amplifier 1503 is disabled (e.g., by opening the switch 1552). The data leakage current of the data column 1002 is stored in the sense amplifier 1502 in a similar manner as the reference leakage current is stored in the sense amplifier 1003. In the data sensing mode, the reference column 1001 and the data column 1002 remain enabled, and the sense amplifiers 1501 and 1503 are enabled (e.g., by closing switches 1532 and 1552) so that the diode connected PMOS transistors 1531 and 1551 are coupled to the reference column 1003 and the data column 1002, respectively, to present a load on the columns. The reference current from the reference column 1001 is applied to a first input of the operational amplifier 1504 and the data current from the data column 1002 is applied to a second input of the operational amplifier 1504 for sensing.

The switch 1505 may be used as for auto zero of the differential amplifier 1504.

In an alternative embodiment, the PMOS transistors 1531 and 1551 are replaced by resistors.

Figure 16:
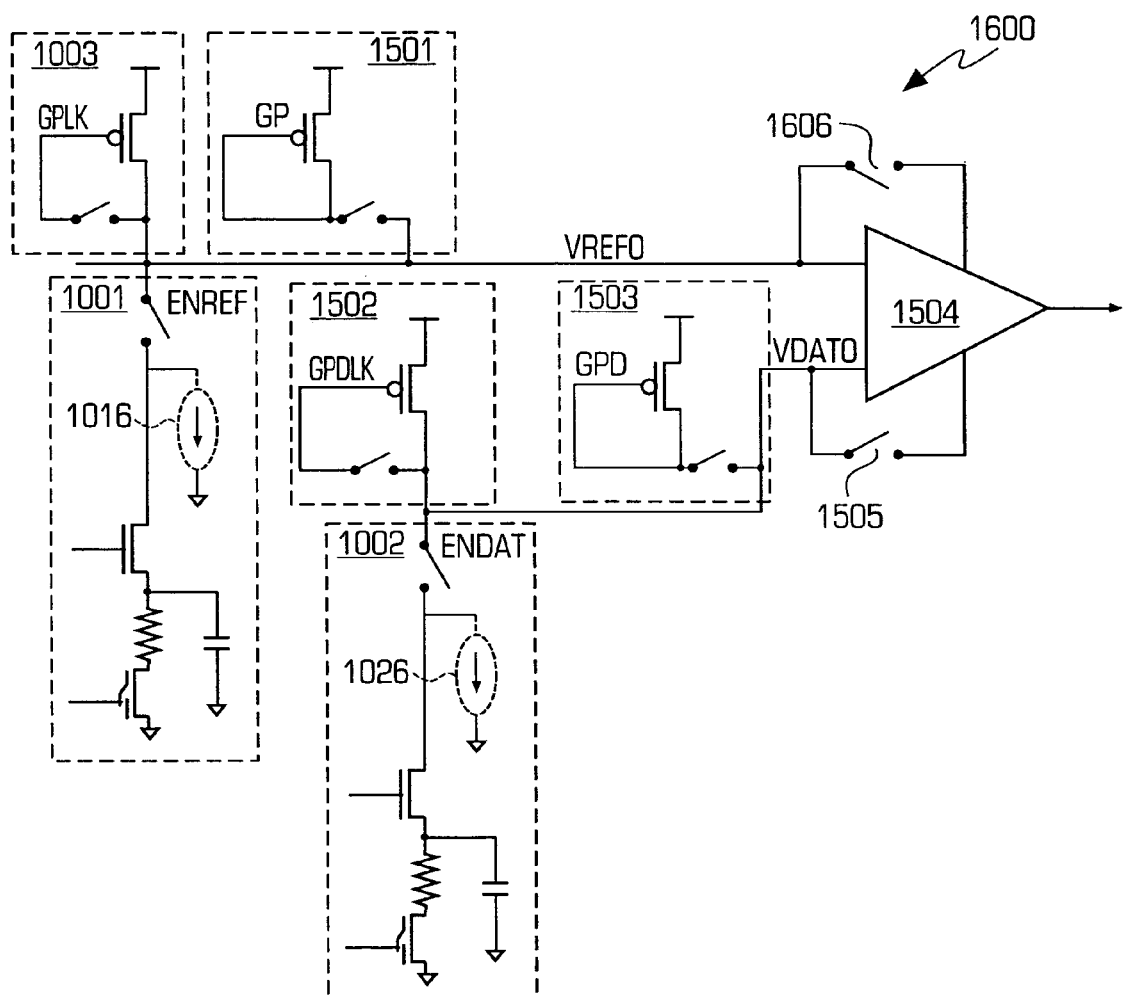
FIG. 16 is a schematic diagram illustrating a sensing system with auto zeroing of the digital multilevel bit memory system of FIG. 1.

FIG. 16 is a schematic diagram illustrating a sensing system 1600.

The sensing system 1600 includes auto zeroing of an operational amplifier. The sensing system 1600 comprises the sensing system 1500 and a switch 1606.

The operation of the sensing system 1600 is now described. The sensing system 1600 operates in a similar manner as the sensing system 1500 but include auto zeroing. The switches 1505 and 1606 are used to auto zero the operational amplifier 1504 before the data sensing mode.

Figure 17:
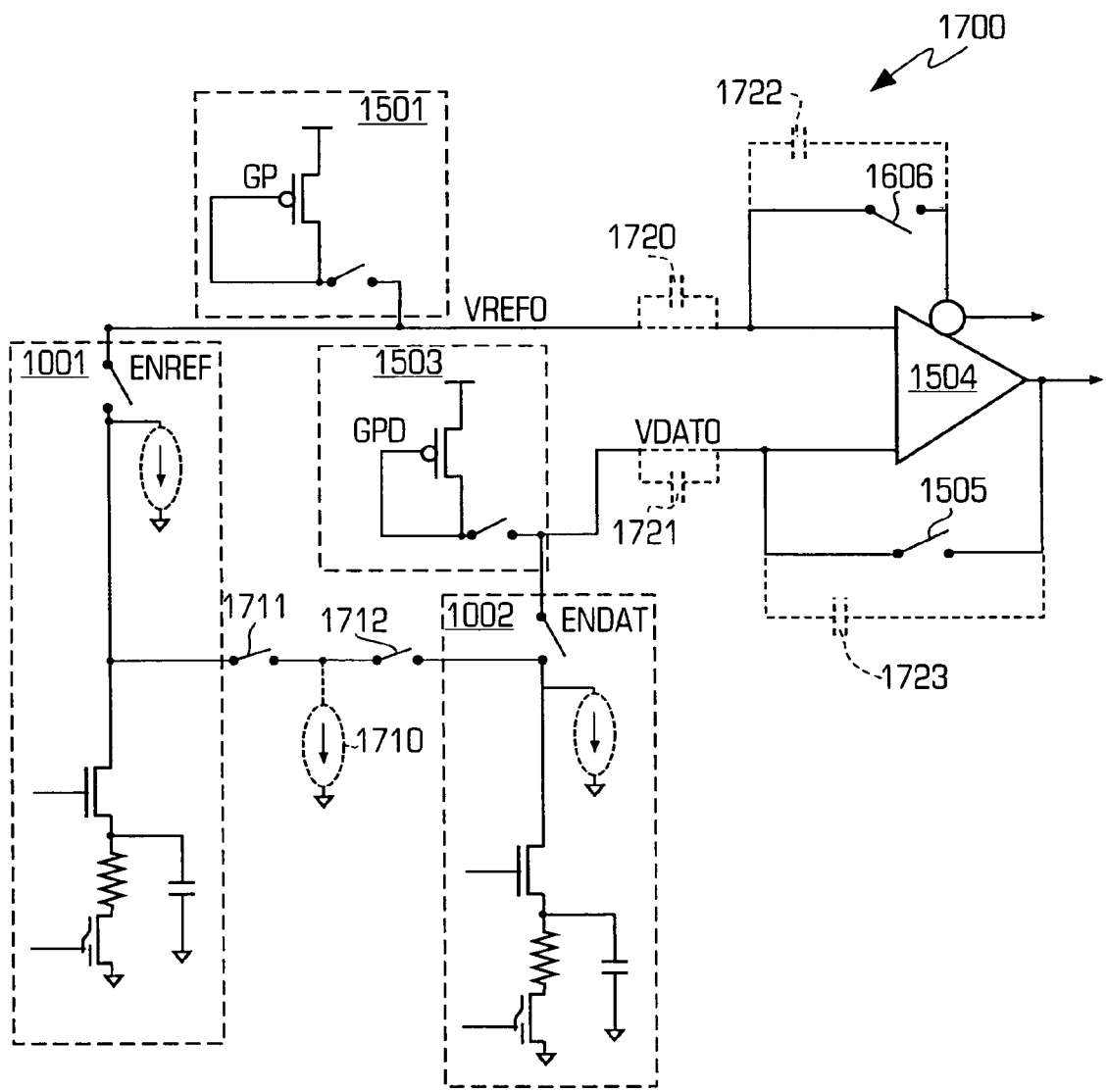
FIG. 17 is a schematic diagram illustrating a sensing system with capacitance auto zeroing of the digital multilevel bit memory system of FIG. 1.

FIG. 17 is a schematic diagram illustrating a sensing system 1700.

The sensing system 1700 includes capacitance auto zeroing. The capacitance auto zeroing cancels the capacitance mismatch of two lines due to interconnect mismatch, transistor mismatch or intended or unintended circuit mismatch. The sensing system 1700 comprises a reference column 1001, a data column 1002, a plurality of sense amplifiers 1501 and 1503, an operational amplifier 1504, a plurality of switches 1505 and 1506, an auto calibration current source 1710, and a plurality of switches 1711 and 1712. (For simplicity and clarity, reference numerals of some elements of the reference column 1003, the data column 1002, and the sense amplifier 1003 are not shown in FIG. 17.) The switches 1711 and 1712 selectively couple the auto calibration current source 1710 to the bit lines of the reference column 1001 and the data column 1002.

The operation of the sensing system 1700 is now described. In a capacitance auto zeroing mode, the auto calibration current source 1710 is used to ramp up or down the bitline of the data column 1002 and the bitline of the reference column 1003 (with the voltage change $\Delta V=I*T/\Delta C$, where I is current on the bitline, T is the time, and C is the capacitance). The auto calibration current from the auto calibration current source 1710 is applied to both the reference line and the data line (e.g., by closing switches 1711 and 1722) and applied to both inputs of the operational amplifier 1504 (e.g., by closing switches 315 and 325) during an auto calibration mode. The difference in the hold voltage equals the difference in the voltages of the bitlines of the data column 1002 and of the reference column 1001 at an auto calibration time. The hold voltage is used to adjust the sensed voltages in the sensing mode to achieve capacitance mismatch cancellation. The sensing system 1700 may be used in a dynamic sensing mode, in which the bitlines are precharged, for example, by the sense amplifiers 1501 and 1503 and then let the cell currents ramp down the bitlines. The sensed voltages on the bitlines are coupled to the differential amplifier 1504 for sensing real time ramp voltages or by pulsing and holding the voltages. The sensing then adjusts for the capacitance calibration voltage before making a sensing decision.

In an alternative embodiment, the sensing system 1700 includes a plurality of capacitors 1720 and 1721 to couple a reference line VREF0 and a data line VDAT0, respectively, to a respective input of the operational amplifier 1504. In an alternative embodiment, the sensing system 1700 includes a plurality of capacitors 1722 and 1723 coupled in parallel with the switches 1606 and 1505, respectively.

In an alternative embodiment, the sensing system 1700 includes loadless circuits coupling a voltage to the reference line VREF0 and the data line VDAT0 instead of the sense amplifiers 1501 and 1503. Examples of capacitor coupling and loadless circuits are disclosed in co-pending published U.S. Patent Application No. US 2003/0103406 A1, published Jun. 5, 2003, the contents of which are incorporated herein by reference.

Figure 18:
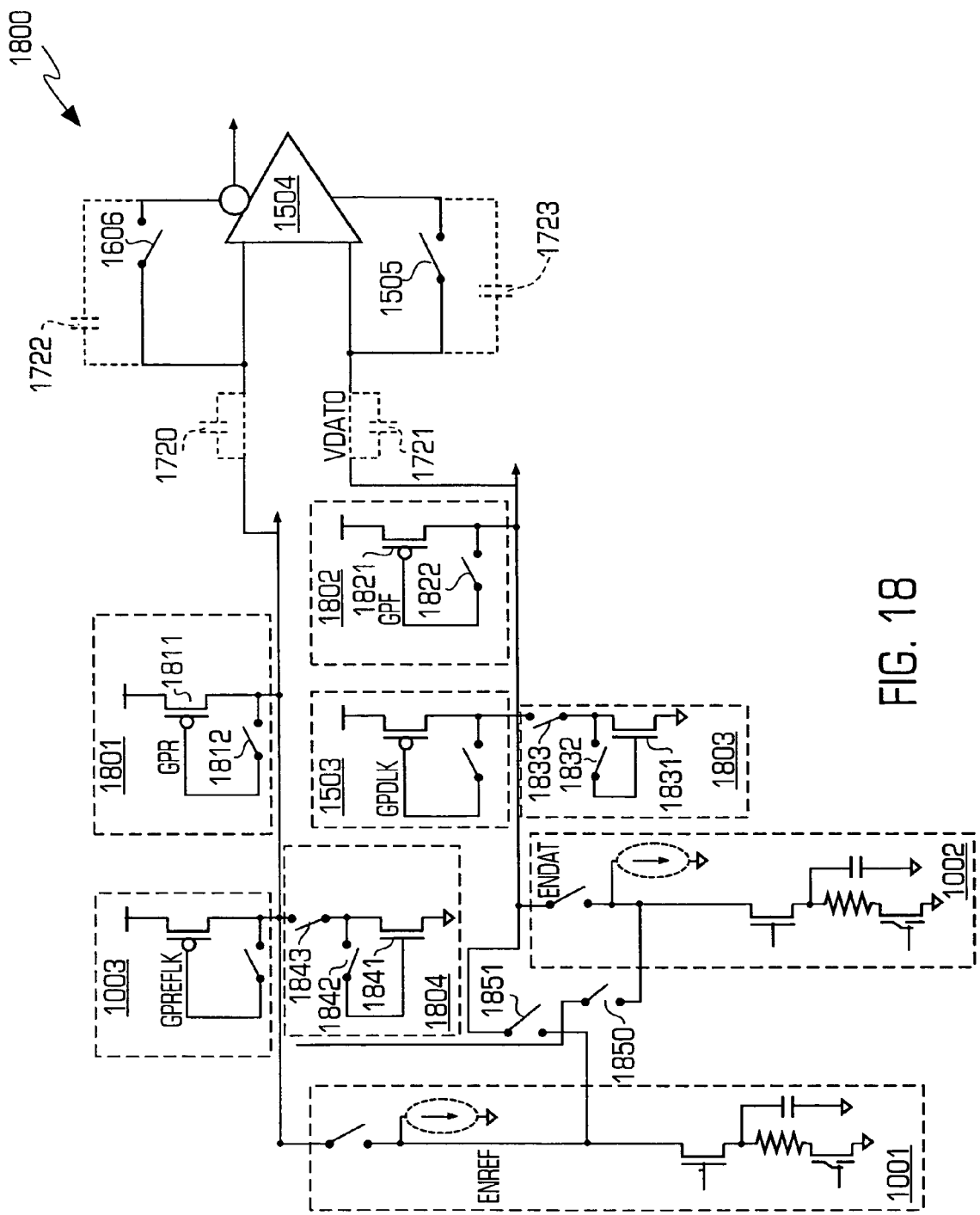
FIG. 18 is a schematic diagram of the sensing system of the digital multilevel bit memory system of FIG. 1.

FIG. 18 is a schematic diagram of the sensing system 1800.

The sensing system 1800 includes leakage cancellation and a differential current differential voltage amplifier. The sensing system 1800 may operate in a dynamic sensing mode, namely the sense voltages on the bitlines are ramping up and down while sensing occurs. The sensing system 1800 comprises a reference column 1001, a data column 1002, an operational amplifier 1504, a plurality of sense amplifiers 1003, 1503, 1801, and 1802, a plurality of storage circuits 1803 and 1804, and a plurality of switches 1505, 1606, 1850, and 1851. The sense amplifier 1801 comprises a PMOS transistor 1811 and a switch 1812. The sense amplifier 1802 comprises a PMOS transistor 1821 and a switch 1822. The storage circuit 1803 comprises an NMOS transistor 1831 and a plurality of switches 1832 and 1833. A storage circuit 1804 comprises an NMOS transistor 1841 and a plurality of switches 1842 and 1843.

The operation of the sensing system 1800 is now described. The leakage current is stored as a compensation current for the reference column 1001 in the storage circuit 1804 using the sense amplifier 1003, the sense amplifier 1801 and the storage circuit 1804 in a manner similar to the sensing system 900 (FIG. 9). The data leakage current is stored in the storage circuit 1803 using the sense amplifier 1503, the sense amplifier 1802 and the storage circuit 1803 in a similar manner as the sensing system 900 (FIG. 9). The sensing system 1800 is used to compare the reference current against the data current by broadening the range of output by comparing on one input of the differential amplifier 1504 the current reference versus the data reference and on the other input of the operational amplifier 1504 the data current versus the reference current. To detect the reference current versus the data current, the switch 1850 applies the data current to the first input of the operational amplifier 1504. The switch 1851 applies the reference current to the second input of the operational amplifier 1504.

In an alternative embodiment, the sensing system 1800 includes a plurality of capacitors 1720 and 1721 to couple a reference line VREF0 and a data line VDAT0, respectively, to a respective input of the operational amplifier 1504. In an alternative embodiment, the sensing system 1800 includes a plurality of capacitors 1722 and 1723 coupled in parallel with the switches 1606 and 1505, respectively.

In an alternative embodiment, the sensing system 1800 includes loadless circuits coupling a voltage to the reference line VREF0 and the data line VDAT0 instead of the sense amplifiers 1501 and 1503.

The switches described above in conjunction with FIGS. 3–18 may be the switches described below in conjunction with FIGS. 19–20.

Figure 19:
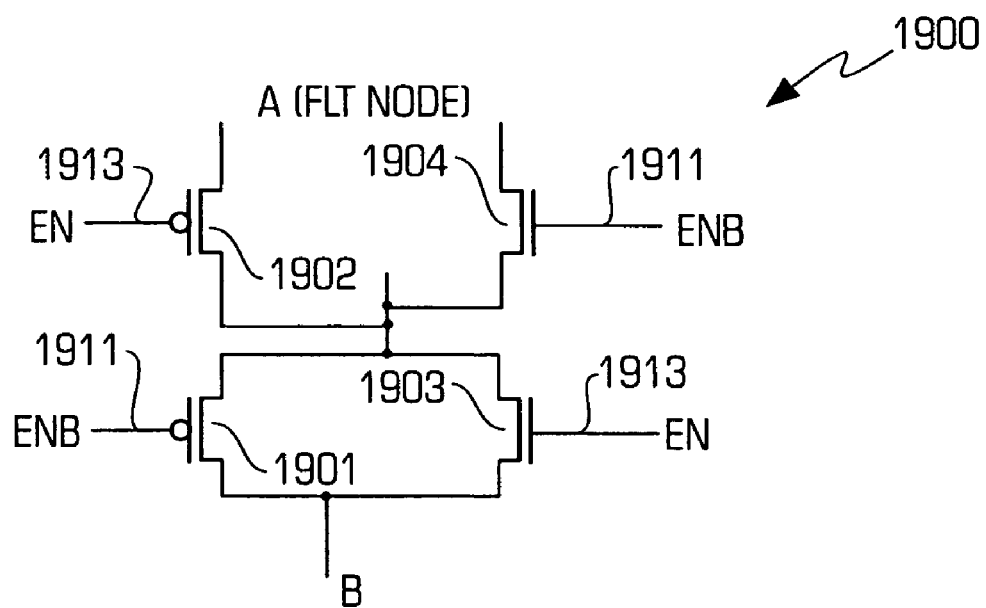
FIG. 19 is a schematic diagram illustrating a first embodiment of a switch of the sensing systems of FIGS. 3–18.

FIG. 19 is a schematic diagram illustrating a switch 1900 of the sensing systems of FIGS. 3–18. The switch 1900 comprises a plurality of PMOS transistors 1901 and 1902 and a plurality of NMOS transistors 1903 and 1904. The transistors 1901 and 1903 are arranged as a transmission gate and are enabled by an inverted enable signal 1911 and an enable signal 1913, respectively. Each of the transistors 1902 and 1904 includes one terminal coupled to a common node formed of the transistors 1901 and 1903 and includes another terminal that floats. The transistors 1902 and 1904 are enabled by the enable signal 1913 and the inverted enable signal 1911, respectively.

Figure 20:
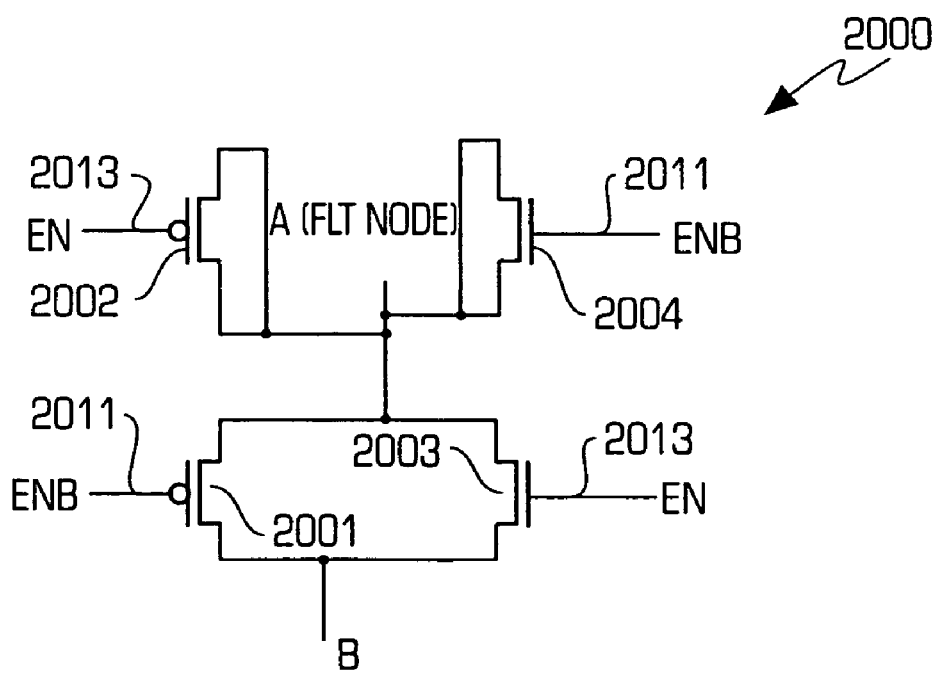
FIG. 20 is a schematic diagram illustrating a second embodiment of a switch of the sensing systems of FIGS. 3–18.

FIG. 20 is a schematic diagram illustrating a switch 2000 of the sensing systems of FIGS. 3–18. The switch 2000 comprises a plurality of PMOS transistors 2001 and 2002 and a plurality of NMOS transistors 2003 and 2004. The transistors 2001 and 2003 are arranged as a transmission gate and are enabled by an inverted enable signal 2011 and an enable signal 2013, respectively. Each of the transistors 2002 and 2004 is arranged as a capacitor with the drain and source coupled to a common node formed of the transistors 2001. The transistors 2002 and 2004 are enabled by the enable signal 2013 and the inverted enable signal 2011, respectively.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A sensing system for a memory comprising:
   a transistor coupled between a voltage terminal and a sense line, said sense line being selectively coupled to a reference cell terminal in a first mode, and to a data cell terminal in a second mode; and
   a switch coupled between the sense line and a bias terminal of said transistor to selectively couple the sense line to the bias terminal in the first mode and to uncouple the bias terminal from the sense line in the second mode.

2. The sensing system of claim 1 wherein the switch comprises a transfer gate.

3. The sensing system of claim 2 wherein the switch further comprises charge compensation elements.

4. The sensing system of claim 1, further comprising a capacitor coupled between the bias terminal of the transistor and either ground or the voltage terminal.

5. The sensing system of claim 1, further comprising a pre-charge circuit coupled to the sense line to pre-charge the sense line in a third mode, the third mode occurring between the first mode and the second mode.

6. The sensing system of claim 5, further comprising a buffer coupled to the sense line.

7. The sensing system of claim 1, further comprising:
   a differential amplifier including a first terminal coupled to the sense line, including a second terminal, including an output; and
   a voltage divider coupled to the second input of the differential amplifier to provide a reference voltage.

8. The sensing system of claim 7 further comprising:
   a switch coupled between the first and second inputs of the differential amplifier to pre-charge the first and second inputs of the differential amplifier in a third mode, the third mode occurring between the first mode and the second mode.

9. The sensing system of claim 1, wherein said sense line is selectively coupled to a plurality of data cell terminals in a serial manner in the second mode.

10. The sensing system of claim 1, wherein the first mode includes coupling the data cell terminal to the sense line and includes storing a voltage indicative of reference leakage current and data leakage current.

11. The sensing system of claim 1, further comprising:
    an operational amplifier including a first input, including a second input coupled to the sense line and including an output for providing a comparison between voltages applied to said first and second inputs;
    a storage circuit coupled to said first input of the operational amplifier; and
    a second switch coupled between the sense line and the first input of the operational amplifier to couple the sense line to the first input in the first mode and to uncouple the first terminal from the sense line in the second mode.

12. The sensing system of claim 11 wherein the storage circuit comprises a capacitive element.

13. A sensing system for a memory comprising:
a transistor coupled between a voltage terminal and a sense line, said sense line being selectively coupled to a reference cell terminal in a first mode, and to a data cell terminal in a second mode; and
a switch coupled between the sense line and a bias terminal of said transistor to selectively couple the sense line to the bias terminal in the second mode and to uncouple the bias terminal from the sense line in the first mode, wherein said sensing line is selectively coupled to a plurality of reference cell terminals in a serial manner in the second mode.

14. The sensing system of claim 13 wherein the sense line is selectively coupled to another data cell terminal in a third mode, said switch couples the sense line to the bias terminal in said third mode, and uncouples the bias terminal from the sense line in a fourth mode, wherein said sensing line is selectively coupled to said plurality of reference cell terminal in a serial manner in a fourth mode.

15. A sensing system for a memory comprising:
a first transistor coupled between a voltage terminal and a sense line, said sense line being selectively coupled to a reference cell terminal in a first mode and to a data cell terminal in a second mode;
a first switch coupled between the sense line and a bias terminal of said first transistor to selectively couple the sense line to the bias terminal in the first mode and to uncouple the bias terminal from the sense line in the second mode;
a second transistor coupled between the sense line and a ground terminal;
a second switch coupled between the sense line and the second transistor to selectively couple the sense line to the second transistor in the second mode and a third mode and uncouple the sense line from the second transistor in the first mode; and
a third switch coupled between the second switch and a bias terminal of said second transistor to selectively couple the second switch to the bias terminal in the second mode and to uncouple the bias terminal from the second switch in the third mode.

16. A sensing system for memory comprising:
a first transistor coupled between a voltage terminal and a sense line, said sense line being selectively coupled to a reference cell terminal and to a data cell terminal;
a first switch coupled between the sense line and the bias terminal of said first transistor to selectively couple the sense line to the bias terminal;
a second transistor coupled between the voltage terminal and a sense line; and
a second switch coupled between the sense line and bias terminal of said second transistor to selectively couple the sense line to said bias terminals,
wherein in a first mode the first switch selectively couples and uncouples a reference cell terminal coupled to a reference cell in an unselected state, in a second mode said second switch selectively couples the bias terminal of the second transistor to the sense line and to the reference cell terminal that is coupled to the reference cell in a selected state, in a third mode the first switch selectively couples and uncouples the bias terminal of the first transistor to a data cell terminal that is coupled to a data cell in an selected state, and in a fourth mode the first and second switches uncouple the bias terminals of the respective first and second transistors from the sensing line and the sensing line is coupled to the data cell terminal which is coupled to the data cell in a selected state.

17. A sensing system for a memory comprising:
a first transistor coupled between a voltage terminal and a sense line, said sense line being selectively coupled to a reference cell terminal;
a first switch coupled between the sense line and a bias terminal of said transistor to selectively couple the sense line to the bias terminal in a first mode during which a reference cell coupled to the reference cell terminal is in an unselected state to apply a leakage current to said bias terminal, to uncouple the bias terminal from the sense line in second and third modes, and to selectively couple the sense line to the bias terminal in a fourth mode to apply a leakage current and a reference cell current from a reference cell in a selected state;
a second transistor coupled between the sense line and a ground terminal;
a second switch coupled between the sense line and the second terminal to selectively couple the sense line to the second terminal in the second and fourth modes and uncouple the sense line from the second transistor in the first and third modes; and
a third switch coupled between the second switch and a bias terminal of said second terminal to selectively couple the second switch to the bias terminal in the second mode and to uncouple the bias terminal from the second switch in the third and fourth modes.

18. A sensing system for a memory comprising:
a transistor coupled between a voltage terminal and a reference cell terminal;
a current source;
a first switch coupled between the reference cell terminal and a bias terminal of said transistor to selectively couple the reference cell terminal to the bias terminal in a first mode and to uncouple the bias terminal from the reference cell terminal in a second mode; and
a second switch coupled between the reference cell terminal and the current source to selectively couple the current source to the reference cell terminal in the second mode and to uncouple the bias terminal from the reference cell terminal in the first mode, wherein a reference cell coupled to the reference cell terminal is unselected in the first mode and is selected in the second mode.

19. A sensing system for memory comprising:
an operational amplifier including first and second inputs and including an output;
a first transistor coupled between a voltage terminal and the first input, said first input being selectively coupled to a reference cell terminal;
a first switch coupled between the first input and the bias terminal of said first transistor to selectively couple the first input to the bias terminal;
a second transistor arranged in a diode configuration;
a second switch coupled between the second transistor and the first input, said second transistor between the voltage terminal and the second switch;
a third transistor coupled between the voltage terminal and the second input, said second input being selectively coupled to a data cell terminal;
a third switch coupled between the second input and the bias terminal of said third transistor to selectively couple the second input to the bias terminal;

a fourth transistor arranged in a diode configuration;

a fourth switch coupled between the fourth transistor and the second input, said fourth transistor between the voltage terminal and the fourth switch;

wherein in a first mode the first switch selectively couples and uncouples the reference cell terminal coupled to a reference cell in an unselected state, wherein in a second mode the third switch selectively couples and uncouples the data cell terminal coupled to a data cell in an unselected state, wherein in a third mode said second switch selectively couples the second transistor to the first input, said fourth switch selectively couples the fourth transistor to the second input, and the reference cell and the data cell are in a selected state.

20. The sensing system of claim 19 further comprising a fifth switch coupled between the inputs of the operational amplifier to auto zero the operational amplifier before said third mode.

21. The sensing system of claim 19 further comprising fifth and sixth switches coupled between the first and second inputs, respectively, of the operational amplifier and corresponding other inputs of the operational amplifier to auto zero the operational amplifier before said third mode.

22. The sensing system of claim 21 further comprising;

a current source;

a seventh switch coupling the current source to the first input before said third mode; and an eighth switch coupling the current source to the second input before said third mode.

* * * * *